(12) United States Patent
Uchiki

(10) Patent No.: US 7,944,246 B2
(45) Date of Patent: May 17, 2011

(54) SIGNAL DETECTING CIRCUIT

(75) Inventor: Hideki Uchiki, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 531 days.

(21) Appl. No.: 11/976,497

(22) Filed: Oct. 25, 2007

(65) Prior Publication Data
US 2008/0100347 A1    May 1, 2008

(30) Foreign Application Priority Data
Oct. 30, 2006  (JP) ................ 2006-294562

(51) Int. Cl.
H03K 5/153    (2006.01)

(52) U.S. Cl. .............. 327/58; 327/63; 327/560; 327/72; 327/90; 330/140; 375/316; 375/328

(58) Field of Classification Search .............. 327/58–60, 327/63–67, 560–563, 72, 82, 90; 330/140; 375/316, 328; 357/316, 328
See application file for complete search history.

(56) References Cited

U.S. PATENT DOCUMENTS

| | | | | |
|---|---|---|---|---|
| 5,650,742 A | * | 7/1997 | Hirano | 327/333 |
| 2005/0040864 A1 | * | 2/2005 | Ficken et al. | 327/65 |
| 2005/0104628 A1 | * | 5/2005 | Tanzawa et al. | 327/63 |
| 2007/0271054 A1 | * | 11/2007 | Chen et al. | 702/85 |

FOREIGN PATENT DOCUMENTS

JP    2000-083069    3/2000

* cited by examiner

*Primary Examiner* — Lincoln Donovan
*Assistant Examiner* — Shikha Goyal
(74) *Attorney, Agent, or Firm* — McDermott Will & Emery LLP

(57) ABSTRACT

A full-wave rectifier circuit receives complementary signals and produces a current corresponding to an added value of differential signals at different levels. A voltage comparator performs a comparison between output signals produced and subjected to current addition and voltage conversion by the full-wave rectifier circuit. A timer detects whether an output signal of the voltage comparator is kept in the same state for a predetermined time or more, and produces a signal indicating a result of the detection. A signal detecting circuit that can accurately identify a state of digital signals of a minute amplitude transferred through a pair of complementary signal lines is achieved without complicating manufacturing steps.

20 Claims, 8 Drawing Sheets

PA1(PA2)

AWR

SIGNAL DETECTING CIRCUIT

BACKGROUND OF THE INVENTION

1. Field of the Invention

The present invention relates to a signal detecting circuit, and particularly to a signal detecting circuit for detecting a differential signal of a minute amplitude.

2. Description of the Background Art

In a data communications field, signals are transmitted at high speed. Differential signals of small amplitudes are used as transmission signals for fast transmission and low current consumption. The differential signal is formed of a pair of complementary signals, which are set to high and low levels relative to a reference potential, respectively. Such differential signal has a signal amplitude doubled as compared with the case of transferring a single signal, and therefore, the differential signal is usually used as the transmission signal in fast digital communications.

In data transmission, synchronization of data must be established between transmission and reception sides. A clock signal is used for establishing such synchronization. As a kind of method for transmitting a clock signal, there has been a method in which a clock signal for synchronization is transferred from a transmission side to a reception side through a signal line other than a signal line for data, or in which a clock signal is embedded in a transmission data string for transmission to a reception side. In the clock-embedded method such as an 8b/10b method, the clock signal is extracted from a received data string, and is reproduced on the reception side. In this clock embedded method, when data is not transferred, data of a predetermined pattern is repetitively transferred for determining whether the data is being transferred or not. For example, in a frame synchronization method, a predetermined flag pattern is repetitively transmitted and received when a digital signal is not transmitted or received.

In the 8b/10b method or the like in which a differential signal is serially transferred as data, a digital signal line pair is kept at a reference voltage level of an intermediate voltage while transmission and reception are not performed, even when a data transmission path is in a normal state. When potentials of complementary signal lines of the transmission path are different from the reference potential, it is determined on the reception side that the transmission is performed, and input (reception) of the transmitted data is performed.

In a data communication method utilizing such transmission path, it is necessary to detect that a communication state is not normal due to an unconnected state on the transmission side, disconnection of the transmission path, failure on the transmission side or others. For detecting such state of the transmission path, a signal detecting circuit is used to determine whether an amplitude of a signal delivered to the reception side is kept smaller than a predetermined value for at least a predetermined time, or more.

In the transmission method, in which a signal line is kept at the reference voltage level when no signal is transmitted, and a signal line potential changes when the data is transmitted, it is necessary to discriminate between a no-signal state and a signal-transmission state for establishing data synchronization.

A patent reference 1 (Japanese Patent Laying-Open No. 2000-083069) has disclosed an example of a signal detecting circuit for detecting such states of a transmission path. In the construction disclosed in the patent reference 1, cross-coupled MOS transistors (insulated gate field effect transistors) are provided between signal lines (a pair of complementary signal lines) transmitting a differential signal and an internal signal detecting node. More specifically, one of the MOS transistors has a gate and a source connected to first and second signal lines forming the complementary signal lines, respectively. The other MOS transistor has a gate and a source connected to the second and first signal lines, respectively. In a no-signal state, the signal detection node is precharged to a level of e.g., a high-side power supply voltage Vh equal to a power supply voltage.

In the no-signal state, the paired complementary signal lines are both kept at a voltage level of an intermediate voltage ((Vh+V1)/2) intermediate between high and low-side power supply voltages Vh and V1. Accordingly, in the no-signal state, the cross-coupled MOS transistors each have the same potential at the source and gate thereof, and are kept off, so that no current flows through the cross-coupled MOS transistors. In the signal transmission, a voltage difference is caused between the first and second signal lines transmitting the differential signal. Thus, a current flows through one of the cross-coupled MOS transistors to change the potential of the signal detecting node. By detecting the voltage change on the signal detecting node or the flowing of the current, the signal receiving state is detected, and the input current is driven.

According to the construction disclosed in the patent reference 1, the transmission side alternately attains a data transmission state and an output high-impedance state in a cycle of a half cycle period of a clock signal. In one clock cycle, therefore, the complementary signal line pair is driven according to transmission data only for a time period of half the clock cycle. On the reception side, the voltage difference between the complementary signal lines is detected using the cross-coupled MOS transistors, and a signal reception detection signal is produced. An input circuit is made active in synchronization with that signal reception detection signal, to take in the received signal. Alternatively, an internally provided clock generating circuit is activated during the signal reception period, and first and subsequent data of received data string is taken-in in synchronization with an internal clock signal generated by the internal clock generating circuit.

By using the signal detecting circuit of the patent reference 1, it may be possible to determine whether the signal lines transmitting the differential signal are in the no-signal state.

When digital signals are to be transmitted and received at a high speed with low power consumption, it is desired to minimize an amplitude of a transmission signal. When the construction disclosed in the patent reference 1 is used for detecting the differential signal of such a minute amplitude, it is necessary to make the threshold voltages of cross-coupled differential MOS transistors as low as possible. Therefore, the MOS transistors for the reception detection must be made different in threshold voltages from MOS transistors of other circuitry, so that a problem of increase of manufacturing steps and therefore increase of cost arise.

First and second signal lines of the complementary signal line pair transmitting the differential signal are coupled to the source nodes of the cross-coupled first and second MOS transistors, respectively. Also, the first and second signal lines are connected to gates of the second and first transistors, respectively. In the signal transmission, therefore, when the first and second signal lines are at the high- and low-levels, respectively, the second MOS transistor is turned on to conduct a current to the second signal line. This current supplied from the second MOS transistor acts to reduce the amplitude (the minute amplitude) of the differential signal, and it may be impossible to detect accurately the received signal. Particularly, in the case when the signal detecting MOS transistors drive both the first and second signal lines to the high side in the data receiving, even when the first and second signal lines are short-circuited to be equalized in potential, the reference voltage could not return to the original intermediate voltage of (Vh+V1)/2, and the reference voltage shifts toward high-side voltage Vh. This state causes a problem that the received signal can no longer be detected accurately.

In the construction disclosed in the patent reference 1, each of the threshold voltages of the cross-coupled MOS transistors defines the detectable amplitude of the differential signal. In this case, the detectable signal amplitude is fixed. Therefore, when the signal amplitude changes, e.g., due to change in interface specification, a signal detecting circuit must be redesigned and re-manufactured.

Further, when a failure in data transmission path for transmission and reception is to be detected through the no-signal state, a criterion for such failure detection cannot be set flexibly depending on a use environment. The patent reference 1 discusses a construction for establishing the synchronization of the transmission data by detecting the voltage level of the signal transmission path, but does not consider a construction for detecting a failure in a signal line of the transmission path.

SUMMARY OF THE INVENTION

An object of the invention is to provide a signal detecting circuit that can accurately detect presence and absence of a differential signal of a minute amplitude.

Another object of the invention is to provide a signal detecting circuit that allows flexible setting of a criterion for determining a no-signal state, and can accurately detect the no-signal state.

Briefly stated, a signal detecting circuit according to the invention receives a differential signal with a high impedance, and determines whether an amplitude of the differential signal is different from an amplitude in a no-signal state, based on a signal corresponding to a difference value of the differential signal and a signal corresponding to a difference value of differential reference voltages at different voltage levels.

In one embodiment of the invention, the signal detecting circuit includes an input circuit receiving complementary input signals with a high impedance, a reference circuit for producing a signal corresponding to a difference value between first and second reference voltages at different levels, and an internal input signal producing circuit for comparing output signals of the input circuit and the reference circuit. The input circuit produces a signal corresponding to a difference value between the complementary input signals. The internal input signal producing circuit performs a comparison between the output signals of the input circuit and the reference circuit to produce a signal indicating logical levels of the complementary input signals according to a result of the comparison.

In another embodiment of the invention, the signal detecting circuit includes an input circuit for producing complementary output signals according to complementary input signals and complementary reference voltages, and an internal signal producing circuit for producing an internal signal according to the output signals of the input circuit. The input circuit includes a first transistor pair receiving on their gates the complementary input signals, and a second transistor pair receiving the complementary reference voltages on their gates, and produces the complementary output signals by differentially amplifying currents flowing through the first and second transistor pairs, respectively. The internal signal producing circuit performs a comparison between the complementary output signals of the input circuit, and produces a signal indicating logical levels of the complementary internal signals according to a result of the comparison.

Preferably, the difference value between the reference voltages is adjustable. Alternatively, output signal amplitudes of the input circuit and the input amplifying circuit are preferably adjustable.

The differential signal is received with a high impedance, and the complementary signal line pair has no current flowing path. Therefore, such a situation can be avoided that both center potentials of the paired complementary signal lines transmitting the differential signal rise toward a high-side power supply voltage level. Thus, the presence of the received signal can be detected.

The detection is made based on the comparison with the reference voltages, using the transistor pair, and the accurate detection can be performed even when the differential signal amplitude is small. Further, it is not required to reduce threshold voltages of the transistor pair, and increase in number of manufacturing steps can be suppressed.

The reference voltage difference or the amplitude of the input signal applied to the input signal producing circuit may be made variable, whereby a criterion value for the amplitude determination of the received signal can be changed, and a digital signal of a minute amplitude can be reliably detected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
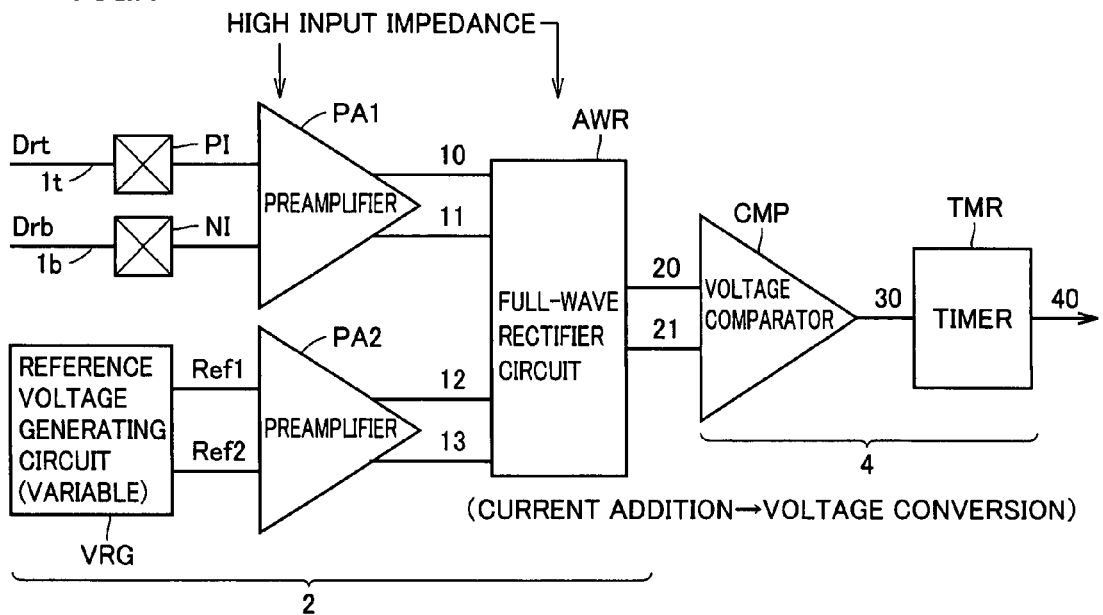
FIG. 1 schematically shows a whole construction of a signal detecting circuit according to a first embodiment of the invention.

FIG. 1 schematically shows a whole construction of a signal detecting circuit according to a first embodiment of the invention. In FIG. 1, the signal detecting circuit includes an input circuit 2 produces, according to a difference value of a differential signal formed of complementary signal Drt, Drb transmitted through complementary signals 1*t* and 1*b* and a difference value between reference voltages Ref1 and Ref2, signals 20 and 21 indicating magnitudes of these difference values, and an internal signal producing circuit 4 that produces a signal 40 indicating a logical level of differential signal Drt, Drb according to complementary output signals 20 and 21 of input circuit 2.

In signal transmission, differential signal Drt, Drb is formed of complementary signals that change toward higher and lower sides by substantially the same amplitude ΔV with a reference voltage (a common level) being a center. Accordingly, the amplitude of differential signal Drt, Drb is given by 2·ΔV. In the following description, when signals Drt and Drb are to be individually referred to, these signals are referred to as "complementary signals".

Input circuit 2 includes a preamplifier PA1 for differentially amplifying differential signal Drt, Drb supplied through input terminals PI and NI, respectively, a preamplifier PA2 for differentially amplifying reference voltages Ref1 and Ref2, and a full-wave rectifier circuit AWR that performs additions (full-wave rectification) on complementary output signals 10 and 11 of preamplifier PA1 and complementary signals 12 and 13 of preamplifier PA2 to produce complementary signals 20 and 21.

Reference voltages Ref1 and Ref2 are produced by a variable reference voltage generating circuit VRG. Reference voltages Ref1 and Ref2 have the voltage levels variable, so that it can be determined whether the differential signal is accurately transmitted, adaptively to the case when the amplitude of the differential signal changes.

The difference value between reference voltages Ref1 and Ref2 supplied from reference voltage generating circuit VRG defines a detection threshold of the difference value (the amplitude of the differential signal) of complementary signals Drt and Drb. The difference value (Ref2−Ref1) between reference voltages Ref1 and Ref2 as well as the amplitude (Drt−Drb) of the differential signal satisfy the following relationship when a significant signal (data signal) is transmitted:

(Ref2−Ref1)<|Drt−Drb|

When the above relationship is not satisfied, a significant signal is not transferred, and it is determined that complementary signal lines 1*t* and 1*r* coupled to respective input terminals PI and NI are in the no-signal state.

Preamplifier PA1, of which internal construction will be described later in detail, has a high input impedance, and does not affect the voltage levels of signals Drt and Drb transmitted to input terminals (pads) PI and NI. Specifically, preamplifier PA1 receives differential signal Drt, Drb on gates of internal MOS transistors. Preamplifier PA2 has substantially the same construction as preamplifier PA1. By using preamplifiers PA1 and PA2, differential voltages with the same center value (common level) can be produced.

Full-wave rectifier circuit AWR receives, as comparison reference voltages, output signals 10-13 of preamplifiers PA1 and PA2, and produces a signal 20 corresponding to an addition value of complementary output signals 10 and 11 of preamplifier PA1 as well as a signal 21 corresponding to an addition value of complementary output signals 12 and 13 of preamplifier PA2. Full-wave rectifier circuit AWR, of which construction will be described later in detail, includes current addition and voltage conversion functions, and output signals 20 and 21 of the rectifier AWR convey information on the amplitude of the differential signal and information on the reference voltage difference value. Full-wave rectifier circuit AWR receives output signals 10, 11, 12 and 13 of preamplifiers PA1 and PA2 on gates of the MOS transistors (insulated gate field effect transistors) with high input impedances, and performs additions of the respective currents. Accordingly, the construction with which the current addition is performed according to the voltage levels of the output signals of preamplifiers PA1 and PA2, and converts results thereof into voltage signals can be easily achieved, using a relatively simple circuit configuration.

Internal signal producing circuit 4 includes a voltage comparator CMP for performing a comparison between magnitudes of addition output signals 20 and 21 supplied from full-wave rectifier circuit AWR, and a timer TMR for determining, according to an output signal 30 of voltage comparator CMP, whether differential signal Drt, Drb having a predetermined amplitude is supplied.

Voltage comparator CMP is merely required to have a circuit construction allowing a comparison between the magnitudes of output signals 20 and 21 of full-wave rectifier circuit AWR. Timer TMR determines whether output signal 30 of voltage comparator CMP is kept at an H level (logically high level) for a predetermined time within a predetermined time period, and sets the logical level of output signal 40 according to a result of the determination. Specifically, timer TMR sets its output signal 40 to an H level when output signal 30 of voltage comparator CMP is kept at an L level (logically low level) for a predetermined time or more. Also, timer TMR sets its output signal 40 to the H level (logically high level) when the L-level period of the output signal of comparator CMP is shorter than a predetermined time. Output signals 20 and 21 of full-wave rectifier circuit AWR include the amplitude information on differential signal Drt, Drb as well as the difference value information on reference voltages Ref1 and Ref2, respectively. Accordingly, voltage comparator CMP compares these signals 20 and 21 with each other, and can determine whether the amplitude of input differential signal Drt, Drb is larger than a value defined by the difference value between reference voltages Ref1 and Ref2.

As described above, timer TMR monitors the output signal of voltage comparator CMP, and thus it becomes possible to determine whether the state in which a significant differential signal of a predetermined amplitude or more is not transmitted continues for the predetermined time. Thus, it is possible to determine whether the non-signal state continues for the predetermined time, and the abnormality or failure in transmission path can be detected.

By using output signal 30 of the voltage comparator, it is possible to detect the transmission timing (amplitude changing timing) of the significant differential signal. Thereby, the synchronization with the transmission signal can be established, using output signal 30 of voltage comparator CMP. Specific constructions will now be described.

Figure 2:
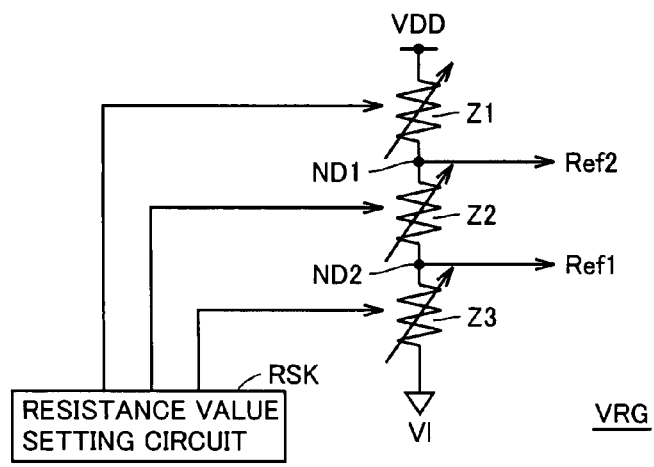
FIG. 2 shows an example of a construction of a reference voltage generating circuit shown in FIG. 1.

FIG. 2 schematically shows a construction of reference voltage generating circuit VRG shown in FIG. 1. In FIG. 2, reference voltage generating circuit VRG includes resistance elements Z1-Z3 connected in series between high- and low-side power supply nodes. Reference voltage Ref2 is produced at a node ND1, and reference voltage Ref1 is produced at a node ND2. These resistance elements Z1-Z3 have variable resistance values. A resistance value setting circuit RSK can set the resistance values of resistance elements Z1-Z3.

(Variable) Reference voltage generating circuit VRG can be configured through the use of the following construction, for example. Specifically, each of variable resistance elements Z1-Z3 is formed of a plurality of unit resistance elements connected in series, and switching transistors are arranged in parallel to these unit resistance elements. These switching transistors are selectively set to the on or off states according to the output signals of resistance value setting circuit RSK. Thus, the resistance values of variable resistance elements Z1-Z3 each can be set to desired values. Resistance value setting circuit RSK may be formed of a register circuit which has a storage value set, e.g., by a system controller, or may be of a fuse program circuit to produce fixedly a switching transistor control signal by selectively blowing fuse elements. In the construction using the stored value of the register circuit, the voltage levels of reference voltages Ref1 and Ref2 can be set to optimum values according to an operation environment after assemble in a system.

In place of the switching transistors, fuse elements may be connected in parallel to the respective resistance elements, and may be set selectively to the conductive or non-conductive states to set the resistance values of resistance elements Z1-Z3. When the programming of these fuse elements is used, it is possible to correct variations in characteristics of the elements occurred in any manufacturing steps, to produce the reference voltage at a desired voltage level.

By changing the resistance values of resistance elements Z1-Z3, the magnitude of the difference value (Ref2−Ref1) between reference voltages Ref1 and Ref2 can be appropriately changed. The difference values (Ref2−Ref1) between the reference voltages is a reference value for determining the amplitude of differential signal Drt, Drb, and the criteria value for the signal state determination can be set to a desired value.

Figure 3:
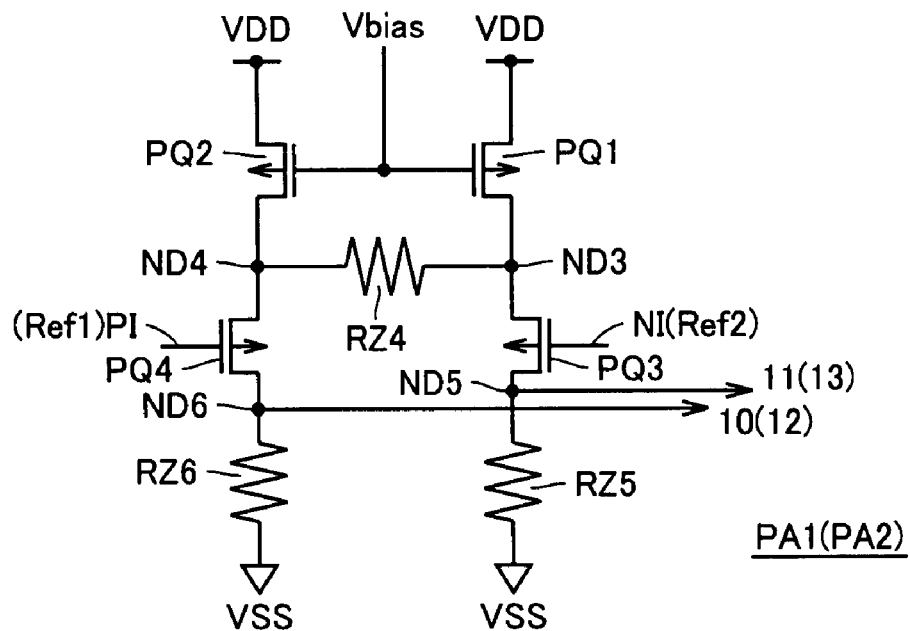
FIG. 3 shows an example of a construction of a preamplifier shown in FIG. 1.

FIG. 3 shows an example of constructions of preamplifiers PA1 and PA2 shown in FIG. 1. Since preamplifiers PA1 and PA2 have the same configuration, FIG. 3 representatively shows the construction of preamplifier PA1.

In FIG. 3, preamplifier PA1 includes P-channel MOS transistors PQ1 and PQ2 that supply constant currents from a high-side power supply node to nodes ND3 and ND4, respectively, according to a bias voltage Vbias, and a resistance element RZ4 connected between nodes ND3 and ND4. Resistance element RZ4 has a relatively small resistance value, and maintains nodes ND3 and ND4 at the same potential during the no-signal state. In the differential operation, resistance element RZ4 forms a current feedback path, and changes substantially linearly the output differential signal according to the amplitude value of the input differential signal.

Preamplifier PA1 further includes a P-channel MOS transistor PQ3 that discharges a current from node ND3 according to a signal voltage of an input terminal NI, a P-channel MOS transistor PQ4 that discharges a current from node ND4 according to a signal voltage on an input terminal PI, a resistance element RZ5 for converting the discharge current supplied from MOS transistor PQ3 into a voltage, and a resistance element RZ6 for converting the discharge current supplied from MOS transistor PQ4 into a voltage.

Output signals 11 and 10 are produced on nodes ND5 and ND6, respectively. As represented inside parentheses in FIG. 3, preamplifier PA2 using the reference voltages is configured such that the gates of MOS transistors PQ3 and PQ4 are not coupled to input terminals NI and PI, but are coupled to receive reference voltages Ref2 and Ref1, respectively. Also, output signals 12 and 13 are produced on nodes ND6 and ND5, respectively.

The operation of preamplifier PA1 shown in FIG. 3 will be described briefly. MOS transistors PQ1 and PQ2 have the same size (the same ratio W/L of a channel width W to a channel length L), and supply currents of the same magnitude defined by bias voltage Vbias. MOS transistors PQ3 and PQ4 have the same size.

In the no-signal state, input terminals NI and PI are kept at a level of an intermediate voltage of (Vh+Vl)/2 between high- and low-side voltages Vh and Vl. In this state, MOS transistors PQ1 and PQ2 receive bias voltage Vbias on their gates, and normally supply currents of a predetermined magnitude. MOS transistors PQ3 and PQ4 have the same current driving capability, and MOS transistors PQ3 and PQ4 supply currents of the same magnitude to resistance elements RZ5 and RZ6, respectively. Resistance elements RZ5 and RZ6 have the same resistance value. In this case, therefore, output signals 10 and 11 are at the same voltage level.

When data transmission is performed, the differential signal having a certain amplitude is applied to cause a voltage difference between input terminals NI and PI. It is now assumed that the voltage level of input terminal PI is higher than that of input terminal NI. In this state, the current driving power of MOS transistor PQ3 becomes larger than that in the no-signal state, and the current driving power of MOS transistor PQ4 becomes smaller than that in the no-signal state. Therefore, MOS transistor PQ4 cannot entirely discharge the current supplied from MOS transistor PQ2, and the voltage level of node ND4 rises. Also, the driving current amount of MOS transistor PQ3 increases, and the voltage level of node ND3 lowers.

Resistance element RZ4 supplies a current from node ND4 to node ND3 according to the voltage difference between nodes ND3 and ND4, and suppresses lowering of the voltage on node ND4. Thereby, MOS transistor PQ3 has a gate to source voltage set according to the signal on input terminal NI, and accordingly, has the current driving power set by the signal on input terminal NI. Also, according to the rising of voltage on node ND4, resistance element RZ4 supplies a current to node ND3, and suppresses the rising of the voltage on node ND4. Accordingly, such a situation can be prevented that in MOS transistor PQ4, the voltage rising of node ND4 cancels the rising of the gate voltage. Thus, the voltage corresponding to the gate voltage (signal voltage on input terminal PI) can be supplied to resistance element RZ6.

That is, a lowering amount in the driving current of MOS transistor PQ4 is equivalently transferred to MOS transistor PQ3 to increase the driving current amount of MOS transistor PQ3.

Thus, the voltage level of resistance element RZ5 becomes higher than the voltage level of resistance element RZ6. Accordingly, the voltage level of output signal 10 becomes lower than the voltage level of output signal 11. The current feedback through resistance element RZ4 can change the output signal of preamplifier PA1 substantially linearly according to the amplitude of the input differential signal, and the voltage levels of input signals 10 and 11 can be complementarily changed from the intermediate value kept in the no-signal state.

When the voltage difference occurs between the complementary signals on input terminals PI and NI, the voltage levels of output signals 10 and 11 change according to the voltage difference. Preamplifier PA1 can output the signals produced through inversion and amplification of the amplitude of the differential signal on input terminals PI and NI.

Preamplifier PA2 sets the voltage levels of output signals 12 and 13 according to the difference value between reference voltages Ref2 and Ref1. In the actual operation, reference voltages Ref1 and Ref2 are kept at constant voltage levels. Therefore, output signals 12 and 13 of preamplifier PA2 are kept at constant voltage levels, and are kept constant in difference value. Such constant difference value is used as the amplitude determination criterion for the input differential signal.

Even when the intermediate voltage level between reference voltages Ref2 and Ref1 is different from the common level (intermediate value) of the differential signal, the signals corresponding to their difference values can be produced by using preamplifiers PA1 and PA2 of the same configuration and characteristics. Therefore, the voltage levels of reference voltages Ref1 and Ref2 can be set independently of the intermediate voltage level (common level) of differential signal Drt, Drb.

In preamplifier PA1, input terminals PI and NI are connected to gates of MOS transistors PQ4 and PQ3, respectively. Gates of these MOS transistors PQ3 and PQ4 are in the input high-impedance state, and the amplifying operation of preamplifier PA1 does not exert any adverse effect on the signal amplitudes of input terminals NI and PI. Therefore, a signal corresponding to the difference in signal voltage level between input terminals NI and PI can be produced. Further, input terminals PI and NI can be accurately set to the intermediate value (common level) upon signal transmission, and the transmission timing of the signal/data can be accurately detected.

Through the use of resistance element RZ4, the input differential signal can be differentially amplified with high accuracy. Nodes ND3 and ND4 are kept at the high-side power supply voltage level, and MOS transistors PQ3 and PQ4 are supplied with sufficient gate to source voltages. Nodes ND3 and ND4 are at sufficiently high voltage levels in the no-signal state, and can cause current changes rapidly responsive to the voltage changes on input terminals NI and PI, and it is not required to decrease the absolute value of the threshold voltages of these MOS transistors. Therefore, the preamplifier can be manufactured in the same manufacturing steps as P-channel MOS transistors in other circuitry, to prevent the manufacturing steps from getting complex.

Figure 4:
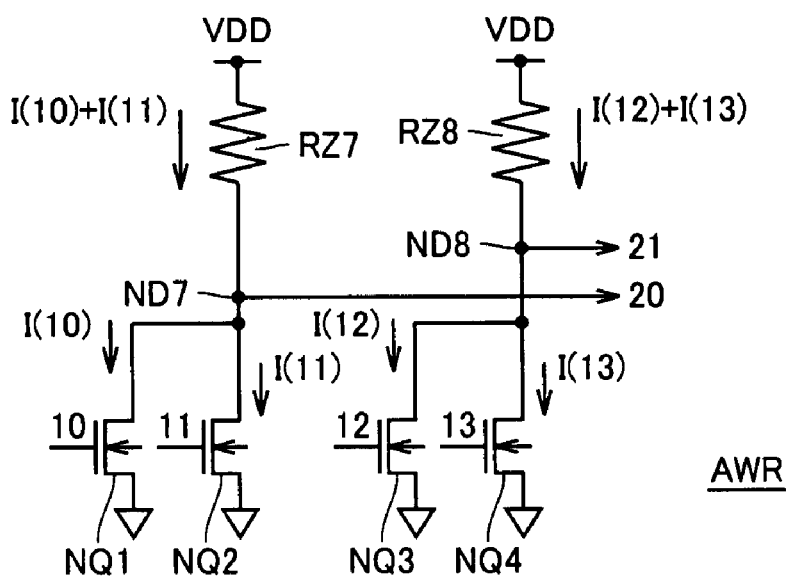
FIG. 4 shows an example of a construction of a full-wave rectifier circuit shown in FIG. 1.

FIG. 4 shows an example of a construction of full-wave rectifier circuit AWR shown in FIG. 1. In FIG. 4, full-wave rectifier circuit AWR includes MOS transistors NQ1 and NQ2 connected between a node ND7 and a low-side power supply node, and N-channel MOS transistors NQ3 and NQ4 connected in parallel between a node ND8 and a low-side power supply node. MOS transistors NQ1 and NQ2 receive output signals 10 and 11 of preamplifier PA1 shown in FIG. 1 on their gates, respectively. MOS transistors NQ3 and NQ4 receive output signals 12 and 13 of preamplifier PA2 shown in FIG. 1 on their gates, respectively.

Full-wave rectifier circuit AWR further includes a resistance element RZ7 connected between the high-side power supply node and node ND7, and a resistance element RZ8 connected between node ND8 and the high-side power supply node. Output signals 20 and 21 are produced at node ND7 and ND8, respectively. The high-side power supply node is supplied with a power supply voltage VDD, and the low-side power supply node is supplied with a ground voltage VSS, similarly to the preamplifier shown in FIG. 3.

In the construction of full-wave rectifier circuit AWR shown in FIG. 4, MOS transistors NQ1 and NQ2 supplies currents corresponding to the voltage levels of output signals 10 and 11 of preamplifier PA1 to the low-side power supply nodes, respectively. Likewise, MOS transistors NQ3 and NQ4 supplies currents corresponding to the voltage levels of output signals 12 and 13 of preamplifier PA2 from node ND8 to the low-side power supply nodes, respectively. Therefore, a current corresponding to the added value of complementary output signals 10 and 11 of preamplifier PA1 flows through nodes ND7 and ND8. Also, a current corresponding to the added value of complementary output signals 12 and 13 of preamplifier PA2 flows through node ND8. It is possible to produce the signals corresponding to the magnitudes of the voltage added value of the input differential signal and the added value of the reference voltages. As will be described below, the currents corresponding to these addition values include the amplitude information of the input differential signal and the difference value information of the reference voltages. The operation of full-wave rectifier circuit AWR will now be described specifically.

Figure 5:
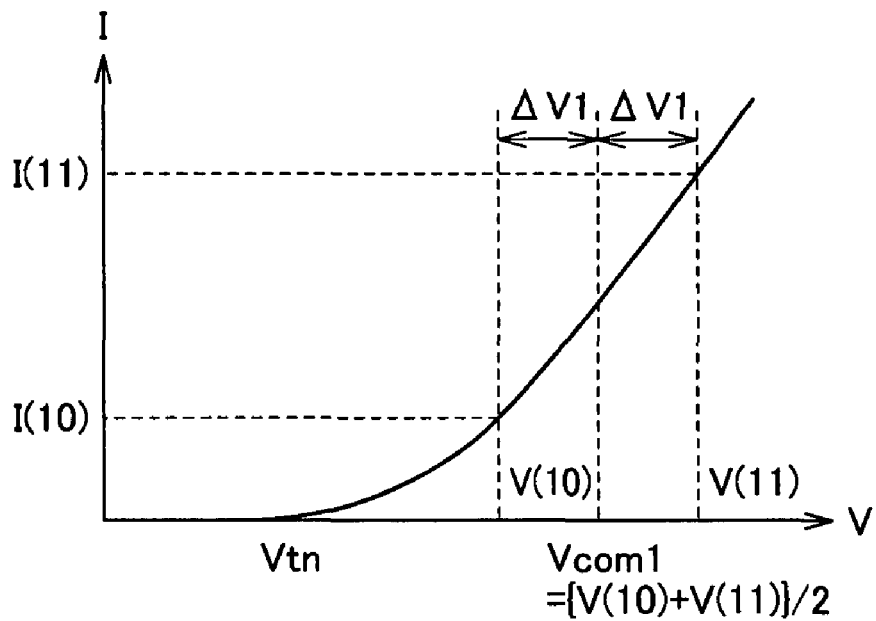
FIG. 5 represents a relationship between a differential signal amplitude and an addition current of the full-wave rectifier circuit shown in FIG. 4.

FIG. 5 shows gate voltage-drain current characteristics of MOS transistors NQ1 and NQ2 in full-wave rectifier circuit AWR. In FIG. 5, MOS transistors NQ1 and NQ2 receives voltages V(10) and V(11) of signals 10 and 11 on their gates, and drive drain currents I(10) and I(1), respectively.

An intermediate value (common level) Vcom1 between those voltages V(10) and V(11) is set to the voltage level of (V(10)+V(11))/2 in signal reception. Each of voltages V(10) and V(11) has a voltage difference ΔV1 with respect to common level Vcom1.

In FIG. 5, a voltage Vtn represents a threshold voltage of MOS transistors NQ1 and NQ2. The drain currents of MOS transistors NQ1 and NQ2 have square characteristics corresponding to the gate voltages.

Figure 6:
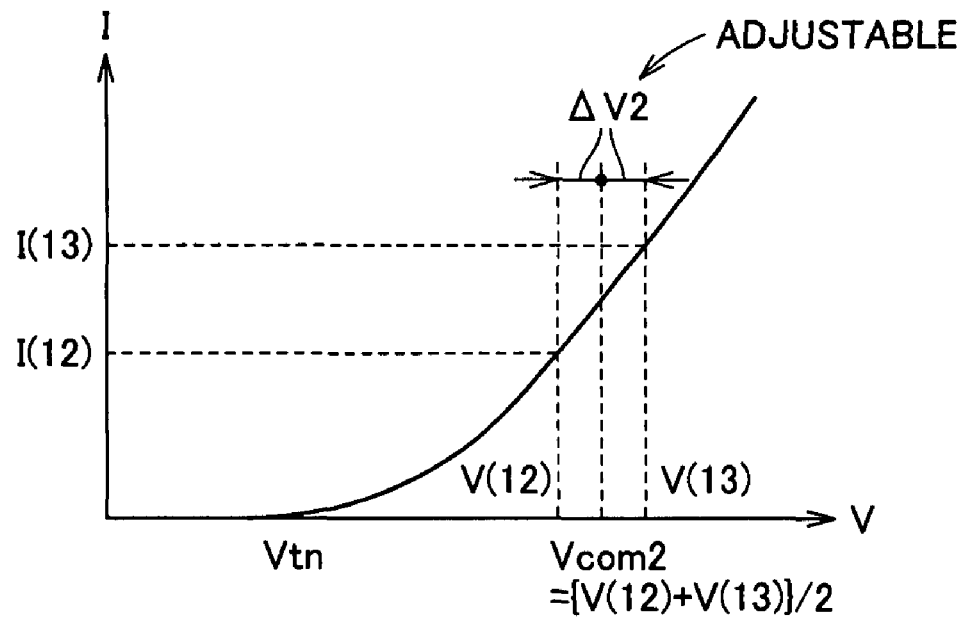
FIG. 6 shows relationship between a reference voltage amplitude and the addition current in the full-wave rectifier circuit shown in FIG. 4.

FIG. 6 shows gate voltage-drain current characteristics of MOS transistors NQ3 and NQ4 of full-wave rectifier circuit AWR shown in FIG. 5. In FIG. 6, MOS transistors NQ3 and NQ4 receive voltages V(12) and V(13) of signals 12 and 13 on their gates, and drive currents I(12) and I(13), respectively. A central value Vcom2 between voltages V(12) and V(13) is given by a voltage of (V(12)+V(13))/2. Voltage Vtn is a threshold voltage of MOS transistors NQ3 and NQ4. MOS transistors NQ1-NQ4 have the same size (the same ratio of channel width to channel length), and also have the same threshold voltage Vtn.

It is assumed that intermediate voltages Vcom1 and Vcom2 are equal to each other. In the signal reception, a relationship of (V(11)−V(10)>V(13)−V(12)) is satisfied. In this state, the following equation is obtained from the square characteristics of the drain current of the MOS transistor:

$$I(20) = I(10) + I(11) \propto (V(10) - Vtn)^2 + (V(11) - Vtn)^2,$$

$$I(21) = I(12) + I(13) \propto (V(12) - Vtn)^2 + (V(13) - Vtn)^2,$$

$$I(20) - I(21)$$

$$\propto V(10)^2 + V(11)2 - V(12)^2 - V(13)^2 - 2 \cdot Vtn(V(10) +$$

$$V(11) - V(12) - V(13)).$$

-continued $$V(10) = Vcom + \Delta V1,$$
$$V(11) = Vcom - \Delta V1,$$
$$V(12) = Vcom + \Delta V2,$$
$$V(13) = Vcom - \Delta V2.$$

The following equation is obtained from $\Delta V1 > \Delta V2$:

$$I(20) - I(21) \qquad (1)$$
$$\propto 2 \cdot (\Delta V1)^2 - 2 \cdot (\Delta V2)^2$$
$$> 0$$

Therefore, the following relationship is satisfied:

$$VDD - V(20) = R \cdot I(20) > VDD - V(21) = R \cdot I(21)$$

In the above expressions, a symbol "^" indicates the square. "R" indicates the resistance value of resistance elements RZ7 and RZ8.

Therefore, the relationship in magnitude between output amplitudes (VDD−V(20), VDD−V(21)) of full-wave rectifier circuit ARW and the voltage amplitudes (V(PI)−V(NI), V(Ref2)−V(Ref1)) of the inputs of preamplifiers PA1 and PA2, is preserved.

When the amplitudes of the input signals on input terminals PI and NI are smaller than amplitude (Ref2−Ref1) of reference voltages Ref2 and Ref1, the voltage levels of output voltages V(20) and V(21) merely change oppositely, and the amplitude relationship of the reference voltages of differential signal Drt, Drb applied to the input terminals is preserved in the outputs of full-wave rectifier AWR.

In full-wave rectifier circuit AWR, therefore, the added values of the signal voltages are converted into the current signals, and comparison is performed on the currents/voltages corresponding to the added values, so that it is possible to identify whether the amplitude of the input differential signal is larger than the amplitude defined by the reference voltage.

Output signal 30 of voltage comparator CMP shown in FIG. 1 attains the voltage level depending on high and low of the voltage levels of output signals 20 and 21 of full-wave rectifier circuit AWR. Thus, when the difference value between complementary signals Drt and Drb, or the amplitude of the differential signal, exceeds the difference value between the reference voltages, output signal 30 of voltage comparator CMP attains the H level. In the no-signal state, output signal 30 of voltage comparator CMP attains the L level. Timer TMR detects the duration time of the L level of the output signal of voltage comparator CMP.

Figure 7:
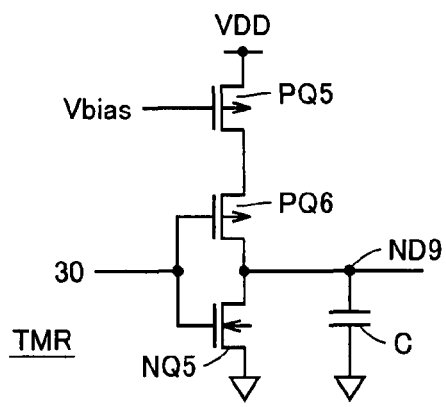
FIG. 7 shows an example of a construction of a timer shown in FIG. 1.

FIG. 7 shows an example of the construction of timer TMR shown in FIG. 1. In FIG. 7, timer TMR includes P-channel MOS transistors PQ5 and PQ6 connected in series between the high-side power supply node and an output node ND9 as well as an N-channel MOS transistor NQ5 connected between output node ND9 and the low-side power supply node.

MOS transistor PQ5 receives bias voltage Vbias on its gate to function as a current source supplying a constant current. MOS transistors PQ6 and NQ5 receive output signal 30 of the voltage comparator on their gates.

Timer TMR further includes a capacitance element C connected between output node ND9 and the low-side power supply node. Capacitance element C is charged with the current determined by bias voltage Vbias, and the L-level period of the output signal 30 is detected according to the charged voltage level of the capacitance element.

FIG. 7 shows bias voltage Vbias determining the charged voltage level of capacitance element C. This bias voltage Vbias may be different in level from bias voltage Vbias shown in FIG. 3.

Figure 8:
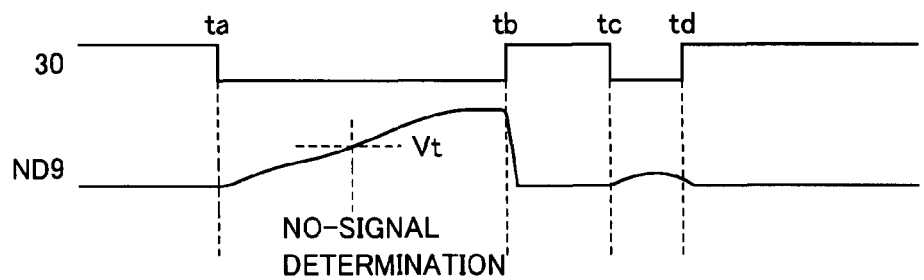
FIG. 8 is a signal waveform diagram representing an operation of the timer shown in FIG. 7.

FIG. 8 is a signal waveform diagram representing an operation of timer TMR shown in FIG. 7. The operation of timer TMR shown in FIG. 7 will now be described.

When output signal 30 of the voltage comparator is at the H level at or before a time ta, MOS transistor NQ5 is on (in an on state), and MOS transistor PQ6 is off (in an off state). Therefore, capacitance element C is discharged to the low-side power supply voltage level, and the voltage level of node ND9 is at the logically low level (L level).

When the signal 30 lowers to the L level at time ta, MOS transistor NQ5 is turned off, and MOS transistor PQ6 is turned on. Accordingly, a current is supplied from the high-side power supply node to capacitance element C through MOS transistors PQ5 and PQ6. The charging current for capacitance element C depends on the current driving power of MOS transistor PQ5 determined by bias voltage Vbias.

In this state, the voltage level of node ND9 gradually rises at a speed that depends on constant current I defined by bias voltage Vbias and the capacitance value of capacitance element C. When it takes a sufficiently long time until a time tb at which output signal 30 of the voltage comparator rises to the H level, the voltage level of node ND9 exceeds a determination criterion level Vt, and will be charged finally to the level of power supply voltage VDD.

At time tb, output signal 30 of the voltage comparator rises to the H level, and MOS transistor NQ5 is turned on to discharge rapidly capacitance element C, so that the voltage on node ND9 attains the L level.

It is now assumed that output signal 30 of the voltage comparator is driven to the L level for a short time between times tc and td. In this case, capacitance element C is charged only for a short period, and the voltage level thereof is lower than determination criterion voltage Vt. In this state, when signal 30 rises to the H level at time tb, node ND9 is immediately driven to the L level.

Therefore, by detecting the charged voltage level of capacitance element C, it is possible to identify the no-signal state or the data signal transmitting state, without using a complicated circuit construction.

Output signal 30 is at the L level in the no-signal state. The time period from time ta to the time when determination criterion value Vt is exceeded, is appropriately set, so that it possible to discriminate accurately the intervals between data in the signal transmission and the abnormal state of the signal path. Determination criterion value Vt is an input logical threshold voltage of a detector (driver) in the next stage. The combination of the input logical threshold voltage of the detector in the next stage, the capacitance value of capacitance element C and the charging current of MOS transistor PQ5 sets the determination timing for determining whether the no-signal state is caused by an abnormality or failure in the path or not.

A circuit in the next stage is configured to detect the no-signal state according to the voltage level of node ND9, for executing necessary processing.

Through the use of output signal 30 of the voltage comparator, it is possible to reproduce a synchronizing clock signal for received data in a data receiver. Specifically, it is now assumed, as disclosed in the patent reference 1 previously described, that data is transferred in half cycle period of the clock signal in the data transmission, and the data signal is set to the high-impedance state in the second half cycle period of the clock signal. In this case, the rising of output signal 30 at time tb shown in FIG. 8 represents that the reception of transmitted data is detected. By utilizing the rising of signal 30, a timing signal for taking in the input data signals can be produced without adversely affecting the voltage level of the received signals.

Modification

Figure 9:
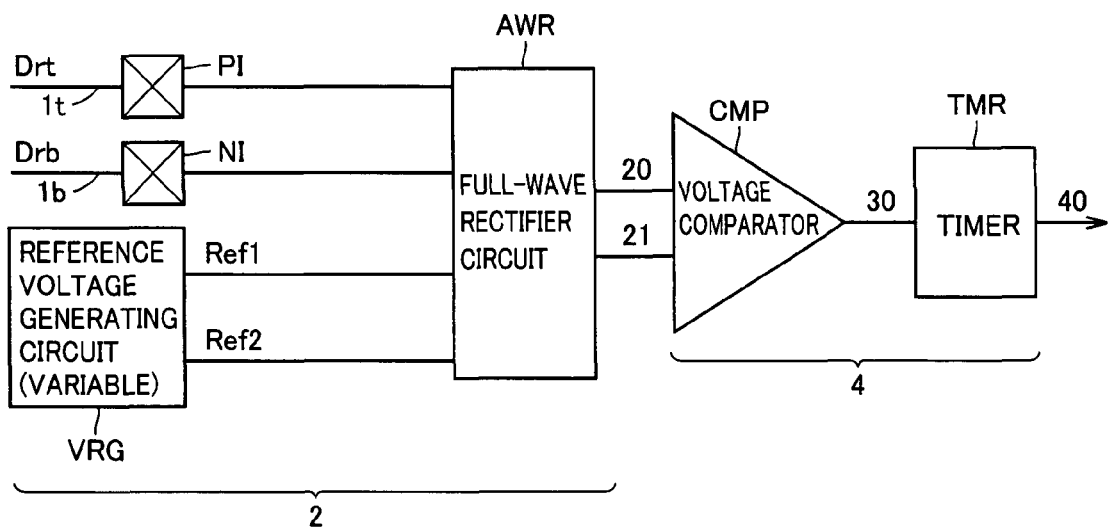
FIG. 9 shows a construction of a signal detecting circuit of a modification of the first embodiment of the invention.

FIG. 9 schematically shows a construction of a signal detecting circuit of a modification of the first embodiment of the invention. The signal detecting circuit shown in FIG. 9 differs from that shown in FIG. 1 in the following configuration. Preamplifiers PA1 and PA2 are not provided in input circuit 2. Input terminals PI and NI are coupled to full-wave rectifier circuit AWR, and reference voltages Ref1 and Ref2 generated by variable reference voltage generating circuit VRG are supplied to full-wave rectifier circuit AWR in place of the signals 12 and 13, respectively.

Other configurations of the signal detecting circuit shown in FIG. 9 are the same as those shown in FIG. 1. The corresponding components are allotted the same reference numerals, and description thereof will not be repeated.

In the construction shown in FIG. 9, the reference voltages and the differential signal satisfy the following relationship:

$$(Drt+Drb)/2=(Ref1+Ref2)/2$$

Thus, the intermediate voltage (common level) of the amplitude of reference voltages Ref1 and Ref2 is equal to the intermediate value (common level) of the amplitude of differential signal Drt, Drb. In this case, it is not necessary to perform the converting operation for equalizing the common levels Vcom by preamplifiers.

In the signal detecting circuit shown in FIG. 9, therefore, full-wave rectifier circuit AWR receives, on gates of the MOS transistors, the input differential signal, and therefore, the operation and effect similar to those of the foregoing signal detecting circuit shown in FIG. 1 can be achieved by the use of the signal detecting circuit shown in FIG. 9. Further, the preamplifiers are not required, and the occupation area and the current consumption by the circuit are reduced.

According to the first embodiment of the invention, as described above, the complementary signals are amplified by the gate-receiving differential amplifier (the amplifier receiving the signals on gates of MOS transistors), the difference value between the reference voltages is produced, the current addition is performed on the complementary signals and the complementary reference voltages to preserve the respective difference values, and the magnitudes of the added value information are compared. Therefore, the presence of the complementary signals of minute amplitudes can be accurately detected without exerting an influence on the input differential signal.

By adjusting the voltage levels of reference voltages Ref1 and Ref2, difference value ΔV2 between the reference voltages can be adjusted, and thus the difference value of the complementary signal pair, or the detection threshold of the amplitude of the differential signal can be adjusted.

Second Embodiment

Figure 10:
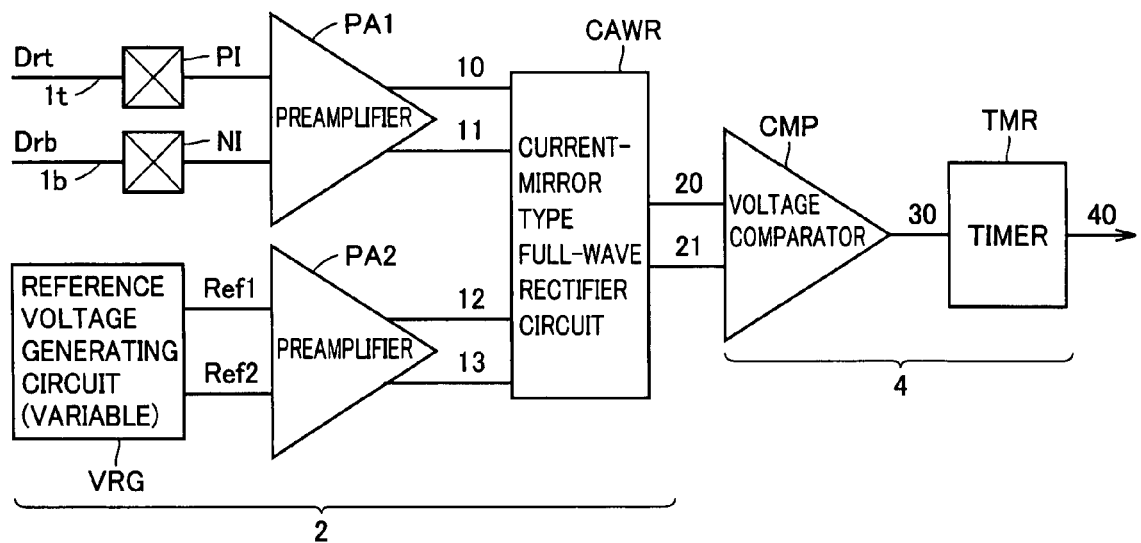
FIG. 10 shows a construction of a signal detecting circuit according to a second embodiment of the invention.

FIG. 10 schematically shows a whole construction of a signal detecting circuit according to a second embodiment of the invention. The signal detecting circuit shown in FIG. 10 differs from that in FIG. 1 in the following configurations. In input circuit 2, a current mirror type full-wave rectifier circuit CAWR is employed for full-wave rectifier circuit AWR. In the current mirror type full-wave rectifier circuit CAWR, differential amplification is performed by a current mirror operation according to the added value of output signals 10 and 11 of preamplifier PA1 and the added value of output signals 12 and 13 of preamplifier PA2, and complementary output signals 20 and 21 are produced.

Other configurations of the signal detecting circuit shown in FIG. 10 are the same as those of the signal detecting circuit shown in FIG. 1. The corresponding components are allotted the same reference numerals, and description thereof will not be repeated.

Figure 11:
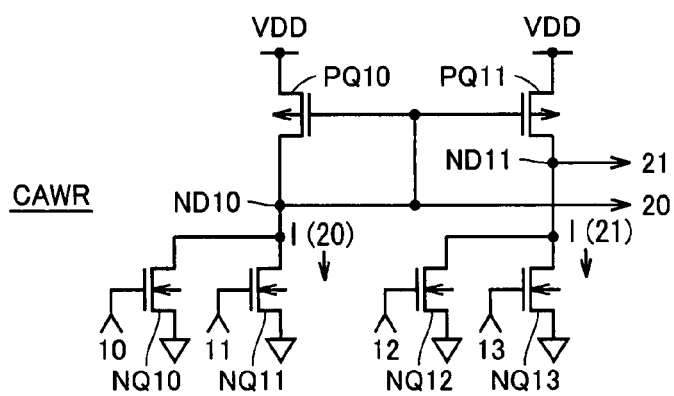
FIG. 11 shows an example of a construction of a full-wave rectifier circuit of a current mirror type shown in FIG. 10.

FIG. 11 shows an example of a construction of the current mirror type full-wave rectifier circuit CAWR shown in FIG. 10. In FIG. 11, the current mirror type full-wave rectifier circuit CAWR includes P-channel MOS transistors PQ10 and PQ11 that are coupled to the high-side power supply node and form a current mirror stage.

MOS transistor PQ11 has a gate and a drain coupled to nodes ND10 and ND11, respectively. MOS transistor PQ10 forms a master of the current mirror stage. MOS transistors PQ10 and PQ11 have the same size, and MOS transistor PQ11 conducts a current of a mirror ratio of 1 of the current flowing through MOS transistor PQ10.

The current mirror type full-wave rectifier circuit CAWR further includes N-channel MOS transistors NQ10 and NQ11 that are connected in parallel between node ND10 and the low-side power supply node, and N-channel MOS transistors NQ12 and NQ13 that are connected in parallel between node ND11 and the low-side power supply node.

MOS transistors NQ10 and NQ11 receive output signals 10 and 11 of preamplifier PA1 shown in FIG. 10 on their gates, respectively. MOS transistors NQ12 and NQ13 receive output signals 12 and 13 of preamplifier PA2 shown in FIG. 10 on their gates, respectively.

In the current mirror type full-wave rectifier circuit CAWR shown in FIG. 11, current I(20) equal to the added value of the currents flowing through MOS transistors NQ10 and NQ11 flows through node ND10. Likewise, current I(21) equal to the added value of the currents flowing through MOS transistors NQ12 and NQ13 flows through node ND11. Therefore, the following equations are obtained, using the notation of currents in FIG. 4:

$$I(20)=I(10)+I(11),$$

$$I(21)=I(12)+I(13).$$

MOS transistors PQ10 and PQ11 form the current mirror stage, and supply the currents of the same magnitude to nodes ND10 and ND11, respectively. When current I(20) is larger than current I(21), MOS transistors NQ12 and NQ13 cannot entirely discharge the current, and voltage V(21) on node ND11 rises. Thus, when the amplitude of the input differential signal is larger than the difference value between the reference voltages, output signals 21 and 20 attain the high and low levels, respectively.

Conversely, when current I(20) is smaller than current I(21), voltage V(21) on node ND11 becomes lower than voltage V(20) on node ND10. In the no-signal state, therefore, output signals 21 and 20 attain the low and high levels, respectively.

The voltage difference between voltages V(20) and V(21) of output signals 20 and 21 on nodes ND10 and ND11 is therefore proportional to the difference between current added value (I(10)+I(11)) and the current added value (I(12)+I(13)). In this case, the currents flowing through MOS transistors PQ10 and PQ11 are equal to each other, but the amounts of the discharging currents of nodes ND10 and ND11 are different from each other. Voltages V(20) and V(21) of output signals 20 and 21 satisfy the following relation:

$$V(20)-V(21) \propto I(20)-I(21) \propto I(10)+I(11)-I(12)-I(13)$$

Similarly to the way of obtaining the expression (1) in the first embodiment described previously, the square characteristics of the drain currents of the MOS transistors are applied to the above relationship. Thus, it is possible to preserve the amplitude of the differential signal and the difference value between the reference voltages in output voltages V(20) and V(21). Therefore, it is possible to determine, from the voltage levels of output signals 20 and 21, whether the amplitude of the input differential signal is larger than the reference voltage difference value. By using such current mirror circuit (MOS transistors PQ10 and PQ11), the current added value can be quickly amplified to produce the complementary signals through the differential operation.

The operation of internal signal producing circuit 4 is substantially the same as that in the first embodiment. Therefore, the no-signal state can be determined more accurately by using the current mirror type full-wave rectifier circuit having high sensitivity.

Modification

Figure 12:
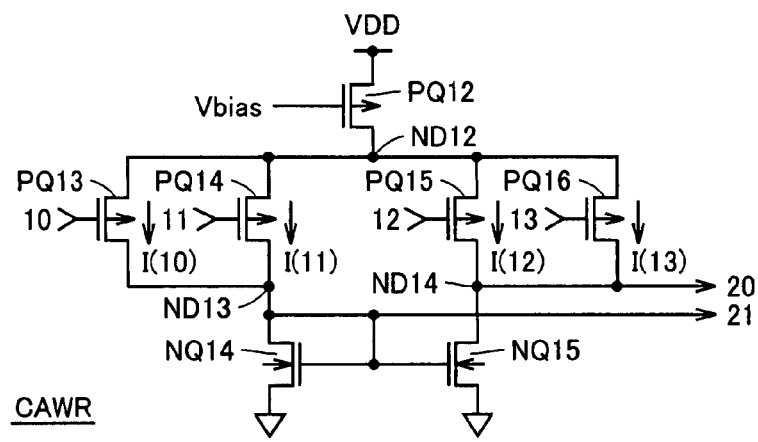
FIG. 12 shows another construction of the full-wave rectifier circuit of the current mirror type shown in FIG. 10.

FIG. 12 shows a modification of current mirror type full-wave rectifier circuit CAWR of the signal detecting circuit according to the second embodiment of the invention. The current mirror type full-wave rectifier circuit CAWR shown in FIG. 12 includes a current source P channel MOS transistor PQ12 for supplying a constant current from the high-side power supply node to a node ND12, and P channel MOS transistors PQ13, PQ14, PQ15 and PQ16 that have source nodes commonly connected to node ND12, and receive signals 10, 11, 12 and 13 on their respective gates.

The drain nodes of MOS transistors PQ13 and PQ14 are commonly coupled to a node ND13. MOS transistors PQ15 and PQ16 have drains commonly coupled to a node ND14. Currents I(10) and I(11) flow through MOS transistors PQ13 and PQ14, respectively. Currents I(12) and I(13) flow through MOS transistors PQ15 and PQ16, respectively. Output signals 21 and 20 are produced at nodes ND13 and ND14, respectively.

The current mirror type full-wave rectifier circuit CAWR further includes N channel MOS transistors NQ14 and NQ15 forming a current mirror stage. MOS transistor NQ14 has a gate and a drain coupled to node ND13, has a source connected to the low-side power supply node and operates as a master of the current mirror stage. MOS transistor NQ15 is coupled between node ND14 and the low-side power supply node, and has a gate coupled to node ND13. MOS transistors NQ14 and NQ15 have the same size, and cause the current flows of the same magnitude.

In the construction of the current mirror type full-wave rectifier circuit CAWR shown in FIG. 12, current (I(10)+(I(11)) flows through MOS transistor NQ14. Current (I(12)+I(13)) passing through MOS transistors PQ15 and PQ16 flows through node ND14. MOS transistors NQ14 and NQ15 pass the currents of the same magnitude. Therefore, the voltage level of node ND14 corresponds to the difference value between added current (I(10)+I(11)) and added current (I(12)+I(13)).

Although the P channel transistors are used for the amplitude detection transistor, the drain current has substantially the same square characteristics as the N channel MOS transistors, and the difference value between the added currents can be represented by the expressions similar to those of the first embodiment as already described. Therefore, the difference value between the added currents preserves the relationship in magnitude between amplitude $\Delta V1$ of the input differential signal and difference value $\Delta V2$ between the reference voltages.

Accordingly, when difference value $\Delta V1$ between complementary signals 10 and 11 is greater than difference value $\Delta V2$, the current flowing through node ND13 is larger than the current flowing through node ND14, and the voltage level of output signal 20 generated from node ND14 is lower than the voltage level of output signal 21 generated from node ND13. Conversely, when the amplitude of input complementary signals 10 and 11 is smaller than the difference value between reference voltages 12 and 13, the current flowing through node ND13 is larger than the current flowing through node ND14. Accordingly, through current mirror operation by MOS transistors NQ14 and NQ15, the voltage level of the signal 20 outputted from node ND14 is made higher than the voltage level of output signal 21 outputted from node ND13.

Voltage comparator CMP in the next stage compares voltage levels of the signals 20 and 21 with each other, and therefore it is possible to determine accurately whether the complementary signal amplitude is equal to or larger than the difference value between the reference voltage values.

In the constructions shown in FIGS. 11 and 12, the construction in which current mirror type full-wave rectifier circuit CAWR operates in the most sensitive region is used according to the relationship between the voltage level of power supply voltage VDD and the voltage level of common level Vcom (=(Vh+V1)/2).

By utilizing the current mirror type full-wave rectifier circuit, it is possible to rapidly perform a comparison between the magnitudes of the input differential signal and the difference value between the reference voltages with high sensitivity due to the differential amplifying operation.

As described above, according to the second embodiment of the invention, the current mirror type full-wave rectifier circuit is used to differentially amplify the current addition value, and rapidly and accurately the difference value between the complementary input signals can be identified. Also, the effect similar to that of the first embodiment can be achieved.

In the second embodiment, it is likewise unnecessary to employ preamplifiers PA1 and PA2 when the intermediate voltage level of reference voltages Ref1 and Ref2 is equal to the common level of differential signal Drt, Drb.

Third Embodiment

Figure 13:
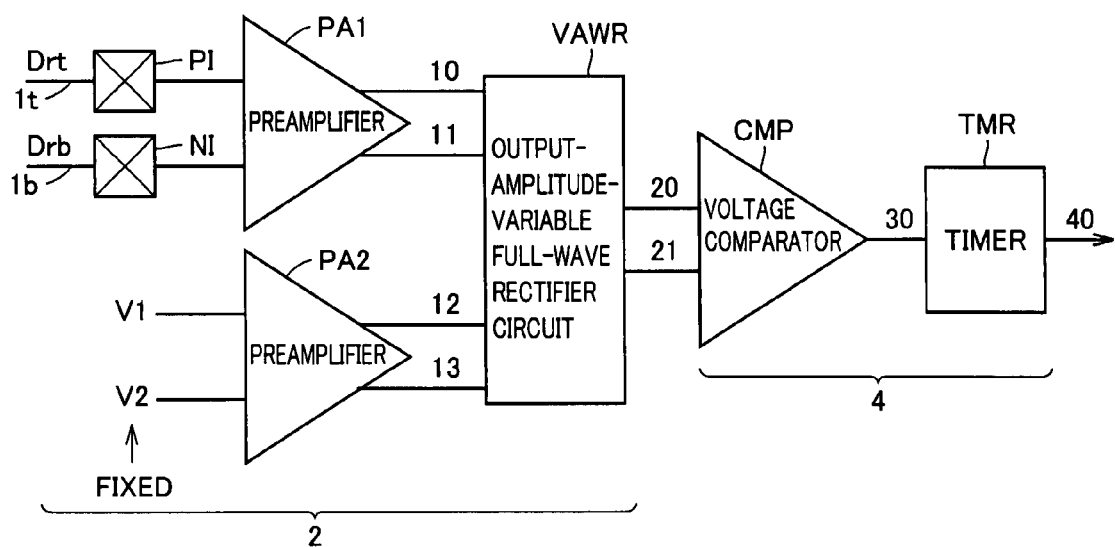
FIG. 13 schematically shows a construction of a signal detecting circuit according to a third embodiment of the invention.

FIG. 13 schematically shows a whole construction of a signal detecting circuit according to a third embodiment of the invention. The signal detecting circuit shown in FIG. 13 differs from the signal detecting circuit shown in FIG. 1 in the following configurations. In input circuit 2, the voltages V1 and V2 applied to preamplifier PA2 are at fixed voltage levels. The full-wave rectifier circuit receiving output signals 10-13 of preamplifiers PA1 and PA2 is formed of an output-amplitude-variable full-wave rectifier circuit VAWR. Output-amplitude-variable full-wave rectifier circuit VAWR adjusts the comparison reference amplitude, to adjust the detection threshold of the amplitude of differential signal Drt, Drb.

Figure 14:
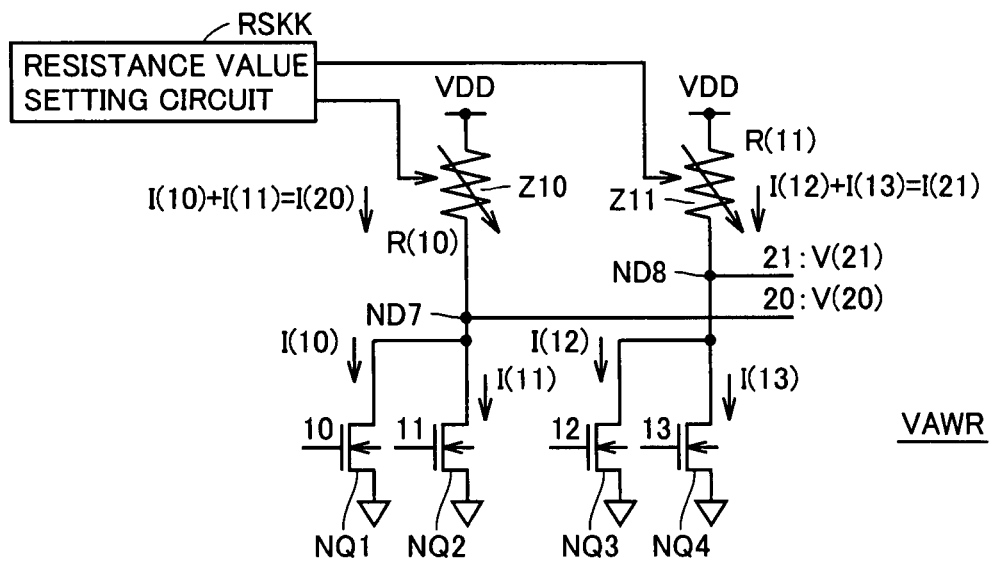
FIG. 14 shows an example of a construction of a full-wave rectifier circuit of an output signal variable type shown in FIG. 13.

FIG. 14 shows an example of the construction of output-amplitude-variable full-wave rectifier circuit VAWR shown in FIG. 13. Output-amplitude-variable full-wave rectifier circuit VAWR shown in FIG. 14 differs from full-wave rectifier circuit AWR shown in FIG. 1 in the following configurations. A variable resistance element Z10 is connected between the high-side power supply node and node ND7, and variable resistance element Z11 is connected between the high-side power supply node and node ND8. A resistance value setting circuit RSKK sets resistance values of variable resistance elements Z10 and Z11. Variable resistance elements Z10 and Z11 have configurations similar to those of the variable resistance elements of the foregoing reference voltage generating circuit shown in FIG. 2, as an example. Thus, the output signal of resistance value setting circuit RSKK selectively sets the switching elements connected in parallel to the respective unit resistance elements to the on or off states. For example, when resistance value setting circuit RSKK is formed of a register circuit, the resistance value setting data thereof may be supplied by initializing a storage value of the register circuit.

Resistance value setting circuit RSKK may be formed of a programmable ROM (read only memory), for example. A storage value of such programmable ROM is made variable depending on a specific application. The programming is made at the field to set the resistance values of variable resistance elements Z10 and Z11 according to the storage value thus programmed (the on and off states of the switching transistors are selectively set). Also, the resistance values of variable resistance elements Z10 and Z11 may be adjusted, using the fuse elements.

Other configurations of output-amplitude-variable full-wave rectifier circuit VAWR shown in FIG. 14 are the same as those of full-wave rectifier circuit AWR shown in FIG. 4. The corresponding components are allotted the same reference numerals, and description thereof will not be repeated.

When output-amplitude-variable full-wave rectifier circuit VAWR shown in FIG. 14 is used, similarly to the foregoing expression (1), for the added value I(20) of the currents flowing through MOS transistors NQ1 and NQ2 and the added value I(21) of currents I(12) and I(13) flowing through MOS transistors NQ3 and NQ4, the following relationship is obtained, where R(10) and R(11) represent the resistance values of respective variable resistance elements Z10 and Z11

$$V(21)-V(20)=R(11) \cdot I(21)-R(10) \cdot I(20),$$

$$\propto 2 \cdot (A-1)(Vcom+Vtn)^2+2 \cdot (A \cdot \Delta V1^2 - \Delta V2^2),$$

where A represents a ratio between resistance values R(11) and R(10) of variable resistance elements Z11 and Z10, and is equal to R(10)/R(11).

Vcom indicates the common level (reference value) of the differential signal, and Vtn indicates the threshold voltages of MOS transistors NQ1-NQ4. Therefore, the first item in the last side of the above expression is a constant.

Difference value $\Delta V2$ between output signals 12 and 13 of preamplifier PA2 is a fixed value corresponding to the fixed value of (V1-V2). Therefore, amplitude $\Delta V1$ of the differential signal can be adjusted according to a ratio A between resistance elements Z10 and Z11. Thus, when the value of resistance ratio A is adjusted for the determination of the magnitudes of voltage levels V(20) and V(21) of output signals 20 and 21, the amplitude $\Delta V1$ of the differential signal can be scaled up or down with respect to difference value $\Delta V2$ between the reference voltages, and accordingly the determination criterion level for difference value $\Delta V1$ of the differential signal can be adjusted.

Thus, the determination of amplitude $\Delta V1$ of the differential signal is performed based on the following relationship:

$$\Delta V1^2 \gtrless \Delta V2^2/A+(A-1) \cdot K/A,$$

where K=Vcom+Vtn

As described above, the output amplitude of the full-wave rectifier circuit that performs the full-wave rectification (current addition) of the complementary signals is made variable, and the determination criterion for the differential signal amplitude can be set to an optimum value, so that the determination criterion can be set to an optimum value depending on an application usage or an operation environment.

In this third embodiment, preamplifiers PA1 and PA2 may not be employed when the common level (intermediate value) of fixed reference voltages V1 and V2 is equal to voltage Vcom or the common level of differential signal Drt and Drb.

According to the third embodiment of the invention, as described above, the output signal of the full-wave rectifier circuit is made variable, and the detection/determination threshold for the differential signal amplitude can be accurately set to an optimum value even when the reference voltages at the fixed voltage levels are used.

Fourth Embodiment

Figure 15:
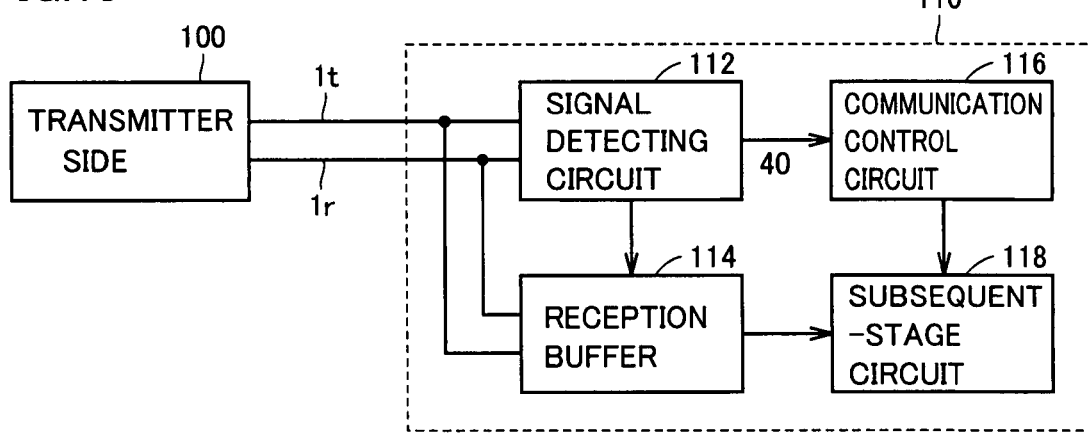
FIG. 15 shows an example of a construction of a communications system according to a fourth embodiment of the invention.

FIG. 15 shows an example of a construction of a communication system including a signal detecting circuit according to the invention. In FIG. 15, the communication system includes a transmitter side 100 and a receiver side 110. Complementary signal line pair 1t and 1r is arranged between transmitter side 100 and receiver side 110. Normally, in the serial data transfer mode, the transmission and reception (sending and receiving) are performed through different signal lines, and a full-duplex data transmission path is arranged for the transmission path. Therefore, complementary signal lines 1t and 1r are each one-way data transfer path for transference from transmitter side 100 to receiver side 110. Multiple pairs of complementary signal lines 1t and 1r may be arranged.

Receiver side 110 includes a signal detecting circuit 112 coupled to complementary signal line pair 1t and 1r, and a reception buffer 114 receiving the data signals transmitted through complementary signal lines 1t and 1r. Signal detecting circuit 112 can have any one of the constructions in the first to third embodiments already described, and has a function of determining whether complementary signal lines 1t and 1r are in the no-signal state for a predetermined time or more.

Receiver side 110 further includes a communication control circuit 116 that receives an output signal from signal detecting circuit 112 and performs the communication control, and subsequent-stage circuitry 118 that processes data transferred from reception buffer 114 for internal transference.

When a timer output signal (40) of signal detecting circuit 112 indicates the no-signal state, communication control circuit 116 determines that a bus abnormality such as a connection failure is present in the transmission path or transmitter side 110, and executes stopping of the operation of subsequent-stage circuitry 118 and necessary abnormality detection processing.

FIG. 15 also shows that reception buffer 114 receives the output signal of signal detecting circuit 112. When complementary signal line pair 1t and 1r is in an abnormal no-signal state, reception buffer 114 may be turned into operation halt state and kept in the output high-impedance state.

Reception buffer 114 may be configured to take in the data utilizing an output signal of the voltage comparator included in signal detecting circuit 112 as the clock signal for data taking-in. Specifically, when complementary signals are transferred via complementary signal lines 1*t* and 1*r*, the data signal is transferred in a half cycle period of the clock signal, and complementary signal lines 1*t* and 1*r* are set to the intermediate voltage (common level) in the remaining half cycle. Therefore, by detecting the voltage changes on complementary signal lines 1*t* and 1*r* in the data transference, it is possible to detect the presence of the reception data signal and the sampling timing of the reception data. In other words, when sampling (taking-in or strobe) of the data may be performed in reception buffer 114 using, as a trigger, the output signal of the voltage comparator in the signal detecting circuit, the data signal transferred via complementary signal lines 1*t* and 1*r* can be reliably taken in. In this case, communication control circuit 116 may control the operation of reception buffer 114 according to the output signal of the voltage comparator of signal detecting circuit 112.

It is sufficient to configure the communication system shown in FIG. 15 to transfer the data via the complementary signal line pair, as is done between a processor and a processor or between a processor and a memory in an operational processing system. Also, in the memory circuit on a single semiconductor chip, transmitter side 100 may be an internal data read circuit, complementary signal line pair 1*t*, 1*r* may be an internal data transmission path, and receiver side 110 may be an output circuit for externally outputting the data. In this case, reception buffer 114 is configured as an internal read buffer for successively transferring data read from an internal data read circuit (transmitter side 100), and subsequent-stage circuitry 118 is configured as an output buffer at the final stage. An influence of the signal propagation delay inside the semiconductor chip can be suppressed, and the internal data signal can be accurately taken in to transfer data.

Even when the amplitude of the transfer signal attenuates or damps on complementary signal lines 1*t* and 1*r*, signal detecting circuit 112 adjusts the data amplitude detection threshold so that the data signal of an attenuated amplitude can be accurately detected.

Therefore, signal detecting circuit 112 according to the invention can be applied to any systems and devices that transfer data through complementary signal line pair on a board or a chip.

According to the third embodiment of the invention, as described above, the operation of the reception buffer that receives the transferred data is controlled according to the output signal of the signal detecting circuit, and it is possible to implement the system that accurately transfers the data signal while suppressing the influence of the transfer lines.

Fifth Embodiment

Figure 16:
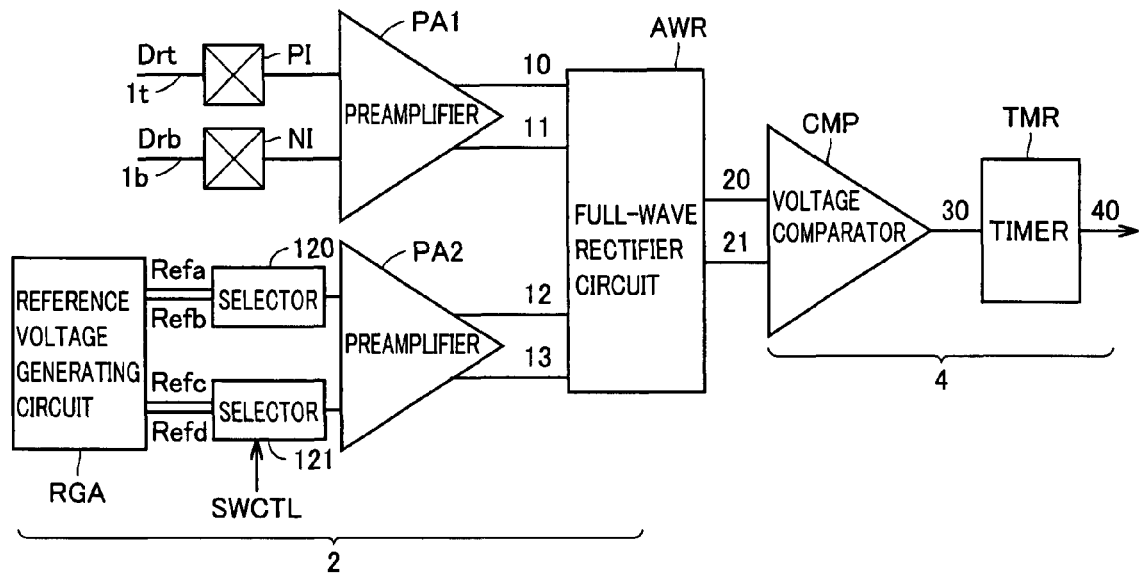
FIG. 16 schematically shows a whole construction of a signal detecting circuit according to a fifth embodiment of the invention.

FIG. 16 schematically shows a construction of a signal detecting circuit according to a fifth embodiment of the invention. The signal detecting circuit shown in FIG. 16 differs from the signal detecting circuit shown in FIG. 1 in the following configurations. A reference voltage generating circuit RGA produces two sets of reference voltages Refa and Refb, and Refc and Refd. These reference voltages are at different voltage levels from each other.

In a stage preceding preamplifier PA2, there are arranged a selector 120 that selects one of reference voltages Refa and Refb according to a switch control signal SWCTL, and a selector 121 that selects one of reference voltages Refc and Refd according to switch control signal SWCTL. The voltages selected by selectors 120 and 121 are applied as the comparison reference voltages to preamplifier PA2. The sets of reference voltages selected by selectors 120 and 121, e.g., the voltage sets (Refa, Refc) and (Refb, Refd) are the same in difference value, but opposite in polarity of outputs 12 and 13 of preamplifier PA2 (with respect to the common level). Thus, these reference voltages satisfy the following relationship:

Refa>Refc, Refb<Refd

The intermediate values (common levels) of these reference voltage sets may be equal to each other, or may be different from each other. Preamplifier PA2 can absorb the difference in common level.

Other configurations of the signal detecting circuit shown in FIG. 16 are the same as those of the signal detecting circuit shown in FIG. 1. The corresponding components are allotted the same reference numerals, and description thereof will not be repeated.

Preamplifier PA2 having the construction shown in FIG. 3 performs the differential amplifying operation. Full-wave rectifier circuit AWR having the construction shown in FIG. 4 and others likewise performs the differential amplifying operation. Usually, an offset is present in the differential amplifier due to variations in element (transistor) characteristics. Accordingly, when the voltage level of the input signal is fixed, an offset is present in the differentially amplified output, and it may be impossible to obtain the differential output at a desired voltage level.

For example, when output signal 12 of preamplifier PA2 shifts to a higher level due to the offset, the difference value between the reference voltages applied to full-wave rectifier circuit AWR resultantly increases. In such state, it may possibly be determined that the transmission path is in the no-signal state, even when the data signal is transmitted. Likewise, in full-wave rectifier circuit AWR, when output signal (comparison) reference voltages 12 and 13 of preamplifier PA2 are at the fixed levels, the comparison determination criterion may fixedly shift due to the offset, and the accurate determination may not possibly be made.

When selectors 120 and 121 are used to switch the voltage levels of the reference voltages applied to preamplifier PA2, the polarities of output signals (reference voltages) 12 and 13 of preamplifier PA2 can be switched so that the offset in preamplifier PA2 is cancelled, and the accurate determination reference is produced. Likewise, in full-wave rectifier circuit AWR, the voltage levels of comparison reference voltages 12 and 13 as received are changed, so that it is possible to cancel the offset due to the variations in characteristic of the transistor elements that receive these input reference voltages 12 and 13 on their gates, and the accurate determination operation (differential amplifying operation) can be achieved.

As for preamplifier PA, in the data transfer, complementary signals Drt and Drb each highly possibly switch in polarity for each transfer data (it is less possible that data of the same logical value are successively transferred), and the offset is cancelled in the data transfer, and no particular problem occurs.

Switch control signal SWCTL for selectors 120 and 121 is sufficient to be generated so as to switch the signals selected by selectors 120 and 121 at an appropriate cycle in view of the period of the data transfer clock signal. Switch control signal SWCTL may be produced, e.g., by communication control circuit 116 shown in FIG. 15. The switching of the reference voltages in the data transfer may be performed while complementary signal lines It and Ir are restored to and at the common level, or may be performed in synchronization with the transmission data. When the reference voltages are to be switched in synchronization with the input differential signal, a clock generator is employed for internally generating an internal clock signal having the same frequency as the data transfer clock signal. When the data transmission is detected, that clock generator is made active, to generate switch control signal SWCTL in synchronization with the internal clock signal.

As described above, according to the fifth embodiment of the invention, the reference voltages for the comparison reference are adapted to be switched in polarity, so that the offset in the differential amplifier can be cancelled, to detect accurately the amplitude of the input differential signal.

In the fifth embodiment, the voltage levels of the reference voltages supplied from reference voltage generating circuit RGA may be made adjustable, similarly to the first embodiment. Similarly to the third embodiment, however, the voltage levels of the reference voltages supplied from the reference voltage generating circuit may be fixed, and the output voltage amplitude of the full-wave rectifier circuit may be made variable. When the common level of a reference voltage set selected by selectors 120 and 121 is the same as the common level of the input differential signal, preamplifiers PA1 and PA2 may be eliminated, similarly to the first embodiment.

Sixth Embodiment

Figure 17:
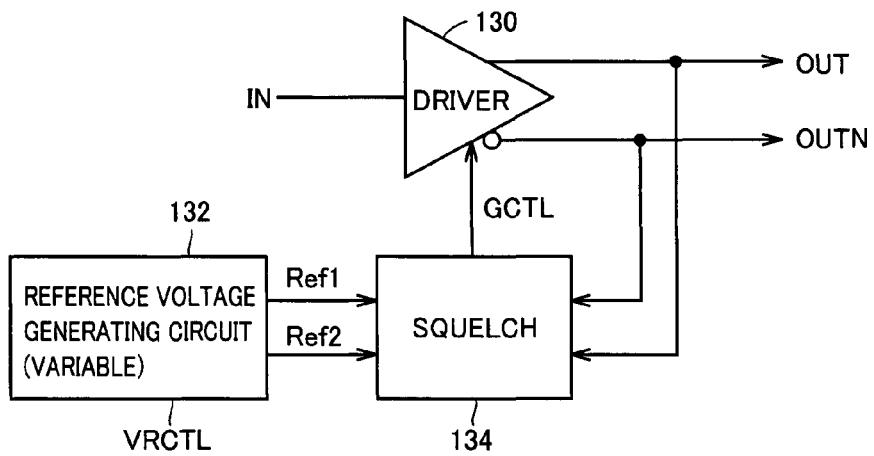
FIG. 17 shows a construction of an example of application of a signal detecting circuit according to a sixth embodiment of the invention.

FIG. 17 schematically shows a construction of application of the signal detecting circuit, according to a sixth embodiment of the invention. In the construction shown in FIG. 17, a driver 130 for producing complementary signals OUT and OUTN according to an input signal IN has a gain that is adjusted according to the amplitude of an output signals of driver 130. Input signal IN of driver 130 may be a differential signal. Driver 130 is merely required to produce complementary signals OUT and OUTN according to the input signal to drive signal lines (not shown). Driver 130 may be a bus driver at a transmitter unit in a communications interface, or may be a driver driving an internal data bus in an integrated circuit device. Driver 130 is merely required to have a circuit configuration to achieve variable gain amplifying function.

A squelch 134 is arranged for controlling the gain of driver 130. Similarly to the construction of any one of the signal detecting circuits of the first to third and fifth embodiments, squelch 134 has a full-wave rectifier circuit and a voltage comparator, and the output signal of voltage comparator CMP is used when the gain control is to be performed.

Squelch 134 receives reference voltages Ref1 and Ref2 produced from a reference voltage generating circuit 132 as well as complementary signals OUT and OUTN produced from driver 130, and makes a comparison between the difference values of these received signals and voltages to control the gain of driver 130 according to the result of the comparison.

When the difference value between output complementary signals OUT and OUTN of driver 130, the amplitude of the differential signal, is smaller than the difference value between reference voltages Ref1 and Ref2, squelch 134 increases the gain of driver 130, and otherwise, maintains the gain of driver 130. Accordingly, the amplitude of output complementary signals OUT and OUTN of driver 130 can be maintained at a predetermined value or more, so that it is possible to suppress the influence of the variations that may occur in load of the output or input signal lines of driver 130 due to an operation environment, and the signal of a desired amplitude can be transferred.

The gain of driver 130 can be adjusted depending on an operation environment, and it is not necessary to set fixedly the gain of driver 130 in consideration of the worst case, so that excessive current consumption of the driver can be suppressed.

The gain of driver 130 can be easily adjusted by adjusting a driving current amount of a current source transistor of driver 130. Specifically, in driver 130, there are provided a plurality of current source transistors in parallel, which are selectively made conductive and non-conductive according to the output signal of squelch 134, or according to the output signal of the voltage comparator.

In FIG. 17, the reference voltages from reference voltage generating circuit 132 are made variable. However, the voltage levels of these reference voltages Ref1 and Ref2 may be variable, and squelch 134 may be configured to adjust the amplitude of the output signal of the full-wave rectifier circuit. Similarly to the fifth embodiment, such a construction may be employed that the reference voltages are selected from a plurality of reference voltage sets produced from reference voltage generating circuit 132, and are supplied to the squelch.

When the complementary signals are applied to driver 130, driver 130 may be selectively deactivated according to an output signal of a timer provided in squelch 134. When the no-signal state continues for a predetermined time or more, complementary output signals OUT and OUTN of driver 130 are at the same voltage level, and the difference value is equal to or lower than the difference value between the reference voltages. Therefore, the timer in squelch 134 is used to detect when the signal transmission is not performed, and the current source transistor in driver 130 is rendered non-conductive according to an output of the timer. Thus, the current consumption in the no-signal state can be reduced.

According to the sixth embodiment of the invention, as described above, the gain of the driver is adjusted according to the magnitude relationship between the amplitude of the complementary output signal of the driver and the difference value between the reference voltages. Therefore, the signal can be accurately transferred with the driver gain adaptively adjusted depending on the operation environment, and a malfunction in the subsequent-stage circuit (a receiver) receiving the output of the driver can be prevented.

The signal detecting circuit according to the invention can be generally applied to any circuits transferring the complementary signals. By applying the signal detecting circuit to the transmission signal path of the very small amplitude signal, it is possible to detect accurately the presence of the minute amplitude signals. In particular, the signal detecting circuit can be applied to the system that serially transfers data via the complementary signal line pair. For example, the inventive signal detecting circuit can be applied to a receiver unit in an interface circuit that performs fast data transmission in a serial transmission mode such as a serial ATA or a PCI express, for accurately identifying the signal transmission state.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A reception circuit comprising:
   a signal detecting circuit connected to complementary signal lines, detecting whether the complementary signal lines are in a non-signal state or not and outputting a detection signal; and a reception buffer connected to the complementary signal lines and transferring data on the complementary signal lines to a subsequent circuit in accordance with the detection signal, the signal detection circuit including:

a first n-type transistor having a first gate electrode coupled to receive a first signal corresponding to one of the signals on the complementary signal lines, a first drain electrode coupled to a first node and a first source electrode coupled to a second node, the first n-type transistor flowing current from the first drain electrode to the first source electrode in response to a voltage on the first gate electrode, a second n-type transistor having a second gate electrode coupled to receive a second signal corresponding to another of the signals on the complementary signal lines, a second drain electrode coupled to the first node and a second source electrode coupled to the second node, the second n-type transistor flowing current from the second drain electrode to the second source electrode in response to a voltage on the second gate electrode, a third n-type transistor having a third gate electrode coupled to receive a first reference voltage, a third drain electrode coupled to a third node and a third source electrode coupled to the second node, the third n-type transistor flowing current from the third drain electrode to the third source electrode in response to the first reference voltage, a fourth n-type transistor having a fourth gate electrode coupled to receive a second reference voltage, a fourth drain electrode coupled to the third node and a fourth source electrode coupled to the second node, the fourth n-type transistor flowing current from the fourth drain electrode to the fourth source electrode in response to the second reference voltage, and a voltage comparing circuit coupled to the first and third nodes, comparing voltages at the first and third nodes to determine whether the voltage at the first node is larger than that at the third node for obtaining the detection signal.

2. The reception circuit according to claim 1, wherein the signal detection circuit further includes:

a first preamplifier including a pair of first transistors receiving, on gates, complementary input voltages via the complementary signal lines, for differentially amplifying gate voltages of the first transistors to produce the first and second signals, and a second preamplifier including a pair of second transistors receiving, on gates, third and fourth reference voltages at different voltage levels, for differentially amplifying the third and fourth voltages to produce the first and second reference voltages.

3. The signal detecting circuit according to claim 1, wherein said complementary input signals are transferred through complementary signal lines; and said input circuit includes:

a first addition circuit including a pair of first transistors receiving, on gates, said complementary input signals, for performing current addition of said complementary input signals, and converting the current added value into the first voltage signal and outputting said first voltage signal, and a second addition circuit including a pair of second transistors receiving, on gates, said first and second reference voltages, for performing current addition of said first and second reference voltages, converting the current added value into the second voltage signal and outputting said second voltage signal.

4. The reception circuit according to claim 1, wherein the signal detection circuit further includes:

a timer circuit determining, according to a signal produced by said voltage comparing circuit, whether a difference value between voltages of the first and second signals is kept smaller than a difference value between the first and second reference voltages for a time duration equal to or longer than a predetermined time.

5. The reception circuit according to claim 4, wherein the timer includes a capacitance element charged according to the signal produced by said voltage comparing circuit.

6. The reception circuit according to claim 1, wherein the signal detection circuit further includes a circuit for adjusting voltage levels of the first and second reference voltages.

7. The signal detecting circuit according to claim 1, wherein said complementary reference voltages are at fixed voltage levels, and said first and second addition circuits further include circuits for changing the voltage levels of their respective output voltage signals.

8. The signal detecting circuit according to claim 1, wherein said input circuit further includes:

a reference voltage generating circuit for producing a plurality of sets of reference voltages, and a selector for selecting the sets of the reference voltages produced by said reference voltage generating circuit so as to change polarities of the complementary reference voltages.

9. The reception circuit according to claim 1, wherein the first and second signals are produced from a driver having a gain adjusted according to the signal produced from the voltage comparing circuit.

10. A reception circuit comprising:

a signal detecting circuit connected to complementary signal lines, detecting whether the complementary signal lines are in a non-signal state or not and outputting a detection signal; and a reception buffer connected to the complementary signal lines and transferring data on the complementary signal lines to a subsequent circuit in accordance with the detection signal, the signal detection circuit including:

a first p-type transistor having a first gate electrode coupled to receive a first signal corresponding to one of the signals on the complementary signal lines, a first drain electrode coupled to a first node and a first source electrode coupled to a second node, the first p-type transistor flowing current form the first source electrode to the first drain electrode in response to a voltage on the first gate electrode, a second p-type transistor having a second gate electrode coupled to receive a second signal corresponding to another of the signals on the complementary signal lines, a second drain electrode coupled to the first node and a second source electrode coupled to the second node, the second p-type transistor flowing current from the second source electrode to the second drain electrode in response to a voltage on the second gate electrode, a third p-type transistor having a third gate electrode coupled to receive a first reference voltage, a third drain electrode coupled to a third node and a third source electrode coupled to the second node, the third p-type transistor flowing current from the third source electrode to the third drain electrode in response to the first reference voltage, a fourth p-type transistor having a fourth gate electrode coupled to receive a second reference voltage, a fourth drain electrode coupled to the third node and a further source electrode coupled to the second node, the fourth p-type transistor flowing current from the fourth source electrode to the fourth drain electrode in response to the second reference voltage, and a voltage comparing circuit coupled to the first and third nodes, comparing voltages at the first and third nodes to determine whether the voltage at the first node is larger than that at the third node for obtaining the detection signal.

11. The reception circuit according to claim 10, wherein the signal detection circuit further includes:

a first preamplifier including a pair of first transistors receiving on gates, complementary input voltage via the complementary signal lines, for differentially amplifying gate voltages of the first transistors to produce the first and second signals, and a second preamplifier including a pair of second transistors receiving, on gates, third and fourth reference voltages at different voltage levels, for differentially amplifying the third and fourth reference voltages to produce the first and second reference voltages.

12. The reception circuit according to claim 10, wherein said signal detecting circuit further includes a timer circuit for determining, according to the signal produced by said voltage comparing circuit, whether a difference value between the first and second signals is kept smaller than a difference value between the first and second reference voltages for a time duration equal to or longer than a predetermined time.

13. The reception circuit according to claim 12, wherein the timer includes a capacitance element charged according to the signal produced by the voltage comparing circuit.

14. The reception circuit according to claim 10, wherein the signal detection circuit further includes a circuit for adjusting voltage levels of the first and second reference voltages.

15. The signal detecting circuit according to claim 10, wherein said input circuit further includes:

a reference voltage generating circuit for producing a plurality of sets of reference voltages, and a selector for selecting the sets of the reference voltages produced by said reference voltage generating circuit so as to change polarities of said complementary reference voltages.

16. The reception circuit according to claim 10, wherein the first and second signals are produced from a driver having a gain adjusted according to the comparison result of the voltage comparing circuit.

17. The reception circuit according to claim 1, wherein the signal detection circuit further includes:

a first p-type transistor having a drain electrode coupled to the first node, and, a second p-type transistor having a drain electrode coupled to the third node, the first and second p-type transistors constituting a current mirror circuit with gate electrodes of the first and second p-type transistors coupled to each other.

18. The reception circuit according to claim 17, wherein the gate electrode and the drain electrode of the first 0-type transistor are coupled to each other.

19. The reception circuit according to claim 10, wherein the signal detection circuit further includes:

a first n-type transistor having a drain electrode coupled to the first node, and a second n-type transistor having a drain electrode coupled to the third node, the first and second n-type transistors constituting a current mirror circuit with gate electrodes of the first and second n-type transistors coupled to each other.

20. The reception circuit according to claim 17, wherein the gate electrode and the drain electrode of the first n-type transistor are coupled to each other.

* * * * *